(12) United States Patent
Saito et al.

(10) Patent No.: US 7,514,277 B2
(45) Date of Patent: Apr. 7, 2009

(54) ETCHING METHOD AND APPARATUS

(75) Inventors: Susumu Saito, Nirasaki (JP); Akitaka Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 222 days.

(21) Appl. No.: 11/224,949

(22) Filed: Sep. 14, 2005

(65) Prior Publication Data

US 2006/0057804 A1 Mar. 16, 2006

Related U.S. Application Data

(60) Provisional application No. 60/614,042, filed on Sep. 30, 2004.

(30) Foreign Application Priority Data

Sep. 14, 2004 (JP) ............................. 2004-266538

(51) Int. Cl.
*H01L 21/302* (2006.01)

(52) U.S. Cl. ..................... 438/16; 438/7; 438/424; 438/719; 438/723; 438/758; 216/60; 216/79

(58) Field of Classification Search .................. 216/60, 216/79, 85, 99; 438/7, 16, 424, 719, 724, 438/756, 757, 18, 723

See application file for complete search history.

(56) References Cited

U.S. PATENT DOCUMENTS

| 6,136,712 A * | 10/2000 | Klippert, II et al. ......... 438/692 |
| 6,903,826 B2 * | 6/2005 | Usui et al. .................. 356/504 |
| 6,919,259 B2 * | 7/2005 | Chang et al. ................ 438/421 |
| 6,982,043 B1 * | 1/2006 | Subramanian et al. ........ 216/48 |
| 2004/0191932 A1 * | 9/2004 | Fuse ............................. 438/9 |

FOREIGN PATENT DOCUMENTS

JP 11-214356 8/1999

* cited by examiner

*Primary Examiner*—George A. Goudreau
(74) *Attorney, Agent, or Firm*—Oblon, Spivak, McClelland, Maier & Neustadt, P.C.

(57) ABSTRACT

An etching method capable of controlling the film thickness of a hard mask layer uniformly is provided. A plasma etching is performed on a native oxide film by using an etching gas containing, for example, $CF_4$ and Ar while a thickness of a silicon nitride film is being monitored and the etching is finished when the thickness of the silicon nitride film reaches a predetermined value. Then, a plasma etching is performed on a silicon substrate by employing an etching gas containing, for example, $Cl_2$, HBr and Ar and using the silicon nitride film as a mask while a depth of a trench is being monitored and the etching is finished when the depth of the trench reaches a specified value.

6 Claims, 3 Drawing Sheets

ETCHING METHOD AND APPARATUS

CROSS-REFERENCE TO RELATED APPLICATIONS

This document claims priority to Japanese Patent Application Number 2004-266538, filed Sep. 14, 2004 and U.S. Provisional Application No. 60/614,042, filed Sep. 30, 2004, the entire content of which are hereby incorporated by reference.

FIELD OF THE INVENTION

The present invention relates to an etching method and apparatus; and, more particularly, to an etching method and apparatus applicable to a device isolation technique such as shallow trench isolation (STI) in a manufacturing process of a semiconductor device.

BACKGROUND OF THE INVENTION

An STI is known as a technique for electrically isolating a device formed on a silicon substrate. The STI process involves the steps of etching a silicon substrate through a mask of, for example, a silicon nitride film to form a trench therein; filling the trench with an oxide film such as $SiO_2$; and finally planarizing the substrate by chemical mechanical polishing (CMP) by way of using the mask (silicon nitride film) as a stopper (see, for example, U.S. Pat. No. 6,844,265).

The silicon trench etching process of the STI includes a break-through (BT) step of performing an etching to remove a native oxide film formed on the surface of a silicon layer after patterning by using, for example, the silicon nitride film as a mask and a main step of performing an etching on the silicon layer from which the native oxide film is removed, to thereby form a trench in the silicon layer (see, for example, Japanese Patent Laid-open Publication No. H11-214356).

Moreover, as a technique related to the STI, there is proposed a method for forming in advance an end point detection layer in the mask to facilitate the detection of an end point of a CMP process, to thereby control a thickness of a device isolation film (see, for example, Japanese Patent Laid-open Publication No. 2003-45956).

Meanwhile, U.S. Patent Publication No. 2004/0191932 discloses a method for performing a plasma etching on a silicon oxide film by using a resist film as a mask, while monitoring the thickness of the resist film by employing an optical method, to thereby prevent a reduction in the thickness of the resist film.

Since the native oxide film formed on the surface of the silicon substrate after the patterning can be removed in a relatively short period of time ranging from about 5 to 10 seconds, the end point of the etching in the BT step is conventionally set based on a lapse of predetermined time. Though the BT step is performed under a condition in which even a hard mask such as a silicon nitride film can be easily etched, if the end point of the BT step is controlled indiscriminately based only on time, the etching will be terminated at a predetermined time point regardless of the residual film thickness of the mask, resulting in non-uniformity in the film thickness of the mask after the BT step. That is, since in general there is variation in the film thickness of the mask present even prior to performing the etching, the film thickness of the mask may still remain non-uniform after the BT step is performed. In the main step following the BT step, the etching rate of silicon is high, whereas etching is performed very slowly on an oxide film or a nitride film. Therefore, a surface polishing is to be conducted during the subsequent CMP process under a condition in which the film thickness of the mask is not uniform.

In the CMP process, since polishing is typically set to be finished upon the exposure of the mask layer such as the silicon nitride film, the residual amount of the buried oxide film may become irregular if the film thickness of the mask layer is non-uniform. Moreover, if the film thickness of the mask is non-uniform, some part of the mask may be left as a residue when the mask is removed after the CMP process by, for example, wet etching. Though it is technically possible to prepare an end point detection layer in the mask to avoid these problems, as disclosed in Japanese Patent Publication No. 2003-45956 cited above, it is not considered practical since it will increase the number of processes required.

SUMMARY OF THE INVENTION

It is, therefore, an object of the present invention to provide an etching method and apparatus capable of controlling the film thickness of a hard mask layer uniformly.

In order to achieve the object, in accordance with a first aspect of the present invention, there is provided a an etching method of a substrate to be processed including a mask layer having a predetermined pattern; a layer to be etched, formed in a groove portion of the pattern; and a base layer formed beneath the mask layer and the layer to be etched, wherein an etching is performed on the layer to be etched while a thickness of the mask layer is being monitored and is finished when the thickness of the mask layer reaches a predetermined value.

It is preferable that the mask layer is a silicon nitride film. Further, preferably, the base layer is a silicon layer and the layer to be etched is a native oxide film formed on a surface of the silicon layer in the groove portion.

Additionally, after etching the native oxide film, an etching may be performed on the silicon layer by using the mask layer as a mask while an etched depth of the silicon layer is being monitored and finished when the etched depth reaches a specified value.

The etching method is preferably applied to a trench etching in shallow trench isolation. In this case, the monitoring of the thickness of the mask layer may involve the steps of irradiating a light to the mask layer; detecting a reflected light from a surface of the mask layer and a reflected light from an interface between the mask layer and the silicon layer; calculating a spectral reflectance; and measuring the thickness of the mask layer based on a calibration curve obtained in advance by employing a curve fitting method.

In accordance with a second aspect of the present invention, there is provided an etching apparatus for performing an etching on a substrate to be processed including a mask layer having a predetermined pattern; a first layer to be etched, formed in a groove portion of the pattern; and a second layer to be etched, formed beneath the mask layer and the first layer to be etched, including a plasma source for generating a plasma; a processing chamber for performing an etching processing on the substrate by using the plasma; a substrate supporting table, installed in the processing chamber, for mounting the substrate thereon; a gas exhaust unit for depressurizing the processing chamber; a gas supply unit for supplying a gas into the processing chamber; a film thickness monitoring unit for monitoring a film thickness of the substrate by measuring the thickness optically; and a controller for controlling an etching process based on film thickness information provided from the film thickness monitoring unit, wherein the controller terminates the etching of the first layer and concurrently starts the etching of the second layer when the thickness of the mask layer reaches a predetermined value based on the film thickness information provided from the film thickness monitoring unit.

The film thickness monitoring unit may include a light source for irradiating a light toward the substrate to be processed; a spectrometer unit for dispersing a reflected light from the substrate to be processed into its spectrum; a light detection unit for detecting the spectrum; and an operation unit for processing detection results from the light detection unit based on a calibration curve obtained in advance, wherein the film thickness monitoring unit is configured to have the steps of irradiating a light to the mask layer; detecting a reflected light from a surface of the mask layer and a reflected light from an interface between the mask layer and the second layer to be etched; calculating a spectral reflectance; and measuring the thickness of the mask layer based on a calibration curve obtained in advance by employing a curve fitting method.

In accordance with a third aspect of the present invention, there is provided a computer storage medium for storing therein a control program operable on a computer, wherein the control program is executed to control an etching apparatus for use in an etching method of the first aspect.

In accordance with a fourth aspect of the present invention, there is provided a computer storage medium for storing therein a control program operable on a computer, wherein the control program is executed to control an etching apparatus of the second aspect.

In accordance with the present invention, etching is performed while the thickness of the mask layer is being monitored, whereby the thickness of the mask layer can be made uniform. For instance, the present invention may be applied to etching of the native oxide film in STI. Thus, the thickness of the buried oxide film can be made uniform and generation of mask residues can be prevented in a subsequent CMP process.

Further, the first layer to be etched, i.e., the native oxide film, is etched and then the second layer to be etched, i.e., the silicon layer, is etched while the etched depth of the silicon layer being monitored, whereby the residual film thickness of the mask and the depth of the trench can be controlled at the same time. Thus, the STI can be performed precisely.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1A:
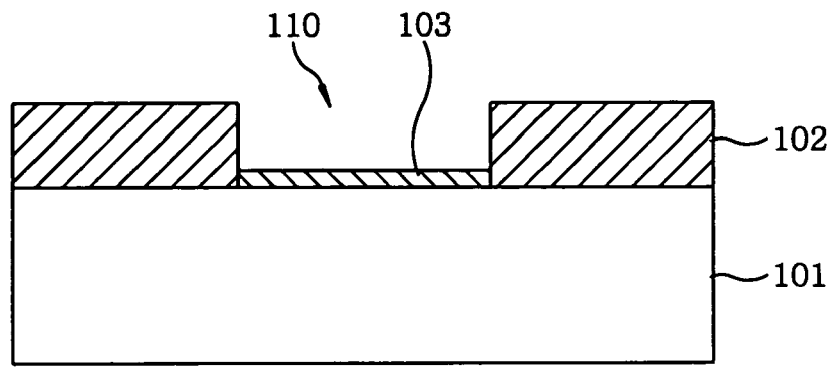
FIGS. 1A to 1C provide schematic cross sectional views of a wafer to describe a preferred embodiment of the present invention.
Figure 1B:
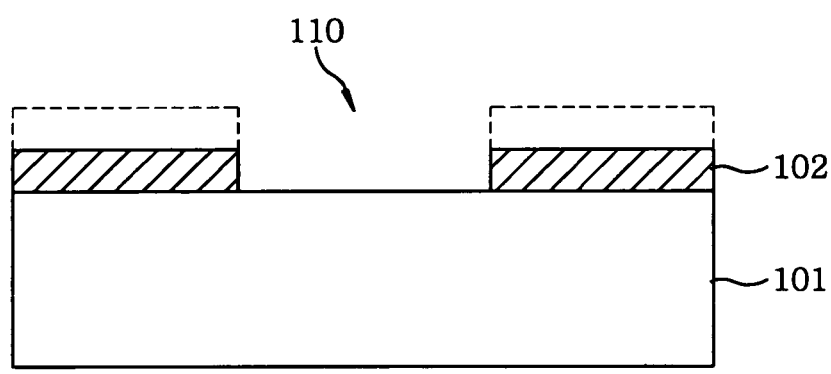
Figure 1C:
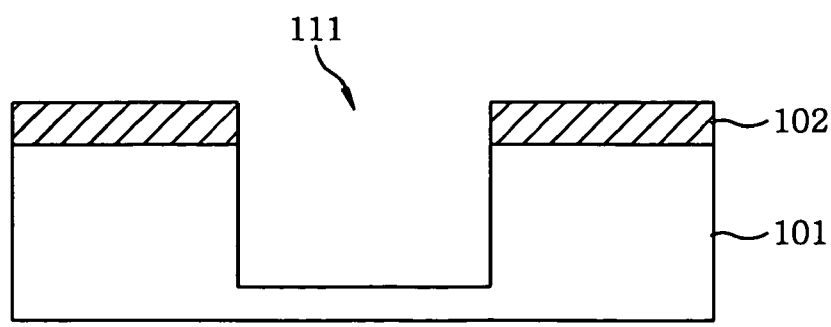

FIGS. 1A to 1C show schematic longitudinal cross sectional views of a wafer W in a silicon trench etching process such as STI in accordance with the preferred embodiment of the present invention. As shown in FIG. 1A, a silicon nitride film 102 such as a $Si_3N_4$, which serves as a hard mask, is formed on a silicon substrate (silicon layer) 101 that forms the wafer W. The silicon nitride film 102 is patterned after a predetermined shape, and a native oxide film 103 of $SiO_2$ is formed in a groove portion 110 of the pattern on the silicon substrate 101.

In a BT step, an etching is performed to remove the native oxide film 103 formed on the surface of the silicon substrate 101 after patterning. Specifically, a plasma etching is conducted by using an etching gas containing, for example, $CF_4$ and Ar in the BT step. At this time, since the silicon nitride film 102 is also etched, the etching is conducted while the thickness of the silicon nitride film 102 is being monitored. Then, when the thickness of the silicon nitride film 102 is reduced to a predetermined value from its initial thickness (marked by a dashed line), as shown in FIG. 1B, the etching of the native oxide film 103 is finished.

Thereafter, an etching is performed by using the residual silicon nitride film 102 as a mask to form a trench in the silicon substrate 101 (main step). That is, the silicon substrate 101 formed of single crystalline silicon is plasma-etched through a hard mask formed of the silicon nitride film 102 by using an etching gas containing, for example, $Cl_2$, HBr and Ar, to thereby form a trench 111 in the silicon substrate 101 as shown in FIG. 1C. For instance, the trench etching in the main step is performed while the depth of the trench 111 is being monitored and the etching may be finished when the depth of the trench 111 reaches a preset value.

Figure 2:
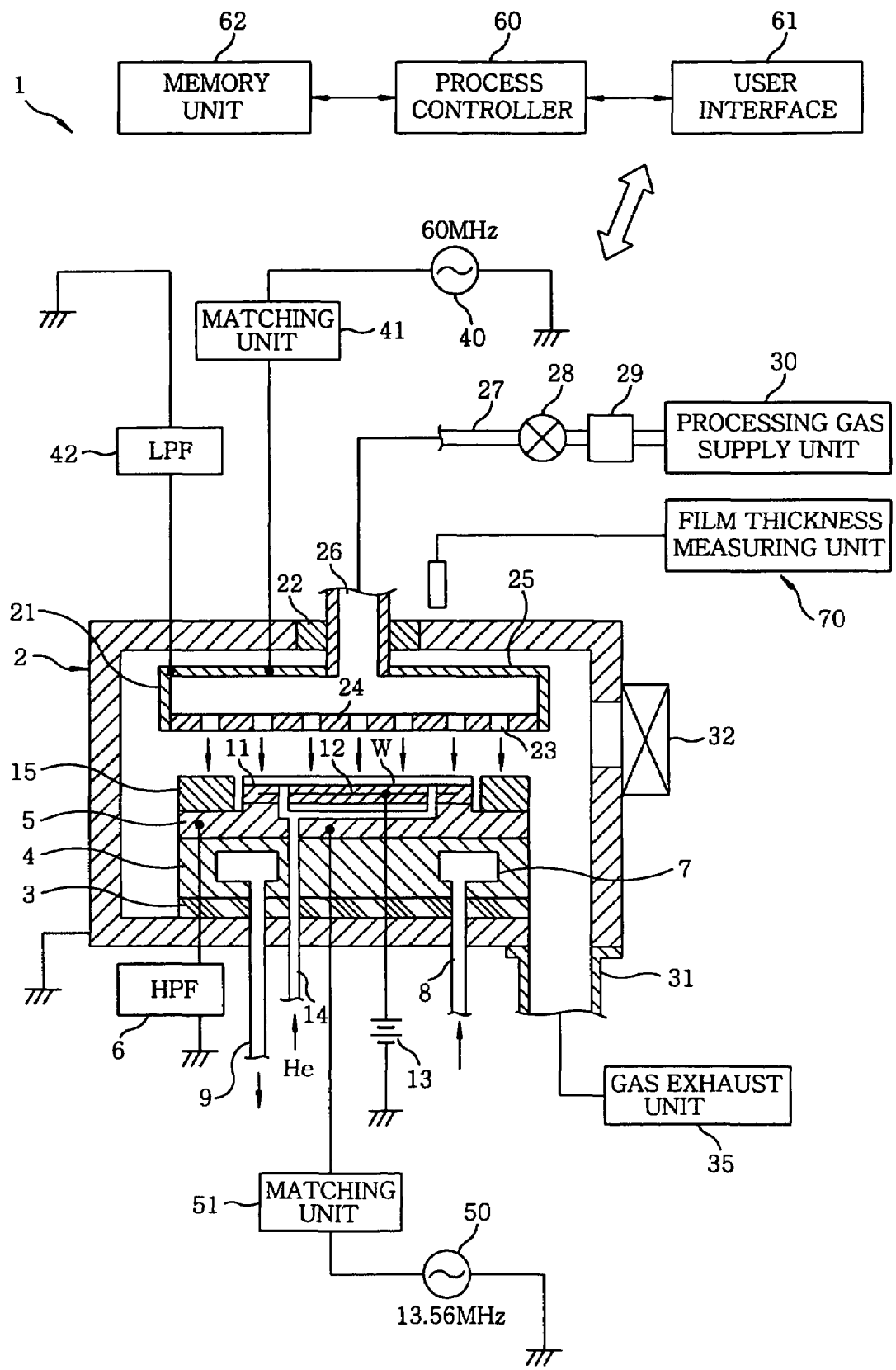
FIG. 2 sets forth a schematic view of a plasma etching apparatus in accordance with the present invention.

FIG. 2 shows a schematic configuration view of a plasma etching apparatus in accordance with the preferred embodiment of the present invention. A plasma etching apparatus 1 is configured as a capacitively coupled parallel plate type etching apparatus in which an upper and a lower electrode plate are disposed in parallel to each other and high frequency power supplies are connected to the electrode plates, respectively.

The plasma etching apparatus 1 includes a cylindrical chamber 2 formed of aluminum whose surface is, for example, alumite treated (anodic oxidized), and the chamber 2 is grounded. Installed on a susceptor support 4 in the chamber 2 is a susceptor 5 for horizontally mounting thereon an object to be processed, i.e., a semiconductor wafer W (hereinafter, simply referred to as a "wafer"), which is formed of, for example, silicon and has specified films formed thereon. Further, the susceptor 5 also serves as a lower electrode, and a high pass filter (HPF) 6 is connected to the susceptor 5.

A temperature control medium space 7 is provided inside the susceptor support 4, and a temperature control medium is introduced into the temperature control medium space 7 through an inlet line 8 to be circulated therethrough, so that the susceptor 5 can be maintained at a predetermined temperature.

The susceptor 5 has an upper central portion of disk shape, which protrudes higher than its peripheral portion, and an electrostatic chuck 11 that is shaped substantially identical to the wafer W is mounted on the upper central portion of the susceptor 5. The electrostatic chuck 11 includes an electrode 12 embedded in an insulating member. The electrostatic chuck 11 electrostatically attracts and holds the wafer w by Coulomb force generated by a DC voltage of, for example, 1.5 kV applied to the electrode 12 from a DC power supply 13 coupled to the electrode 12.

Further, formed through an insulating plate 3, the susceptor support 4, the susceptor 5 and the electrostatic chuck 11 is a gas channel 14 for supplying a heat transfer medium, for example, a He gas, to the rear surface of the wafer W that is kept under a predetermined back pressure. Thus, heat is transferred between the susceptor 5 and the wafer W through the heat transfer medium, so that the wafer W can be maintained at a predetermined temperature.

Moreover, an annular focus ring 15 is disposed on the peripheral portion of the susceptor 5 to surround the wafer W loaded on the electrostatic chuck 11. The focus ring 15 is formed of an insulating material such as ceramic or quartz and serves to improve uniformity of etching.

An upper electrode 21 is disposed above the susceptor 5 to face it in parallel and is supported at an upper portion of the chamber 2 via an insulating member 22. The upper electrode 21 includes an electrode plate 24 that faces the susceptor 5; and an electrode support 25 that serves to support the electrode plate 24 and is made of a conductive material, for example, aluminum whose surface is alumite treated. The electrode plate 24 is formed of, for example, quartz and is provided with a number of injection openings 23. The distance between the susceptor 5 and the upper electrode 21 is adjustable.

A gas inlet port 26 is formed at a center of the electrode support 25 of the upper electrode 21 and coupled to a gas supply line 27. Further, the gas supply line 27 is connected to a processing gas supply source 30 via a valve 28 and a mass flow controller 29, and an etching gas for plasma etching is supplied from the processing gas supply source 30. Though there is shown in FIG. 2 only one processing gas supply source 30, the plasma processing apparatus is provided with a plurality of process gas supply sources capable of supplying, for example, a $CF_4$ gas, an Ar gas, a $Cl_2$ gas, an HBr gas, an $O_2$ gas and the like into the chamber 2 while the flow rates thereof being individually controlled.

A gas exhaust pipe 31 is connected to a bottom portion of the chamber 2 and coupled to a gas exhaust unit 35. The gas exhaust unit 35 includes a vacuum pump such as a turbo molecular pump, and serves to reduce the inner pressure of the chamber 2 down to a predetermined vacuum level, e.g., 1 Pa or less. Further, a gate valve 32 is installed on a sidewall of the chamber 2. The wafer W is transferred between the chamber 2 and an adjacent load lock chamber (not shown) while the gate valve 32 is opened.

A first high frequency power supply 40 is connected to the upper electrode 21 via a matching unit 41. Further, a low pass filter (LPF) 42 is coupled to the upper electrode 21. The first high frequency power supply 40 has a frequency ranging from 50 to 150 MHz. By applying a high frequency power in such a range, a high-density plasma in a desired dissociation state can be generated within the chamber 2, which makes it possible to execute a plasma processing under a low pressure. The frequency of the first high frequency power supply 40 preferably ranges from 50 to 80 MHz. Typically, its frequency is chosen to be 60 MHz as illustrated in FIG. 2 or thereabouts.

Further, a second high frequency power supply 50 is connected to the susceptor 5 serving as the lower electrode via a matching unit 51. The second high frequency power supply 50 has a frequency ranging from several hundreds of kHz to less than twenty MHz. By applying a power of a frequency in such a range, a proper ionic action can be facilitated without causing any damage on the wafer W. Typically, the frequency of the second high frequency power supply 50 is chosen to be, for example, 13.56 MHz as shown in FIG. 2 or 800 kHz.

The plasma etching apparatus 1 includes a film thickness measuring unit 70 serving as a film thickness monitoring device. The film thickness measuring unit 70 irradiates a light of multiple wavelengths toward the wafer W, and measures a film thickness by detecting a reflected light therefrom.

Figure 3:
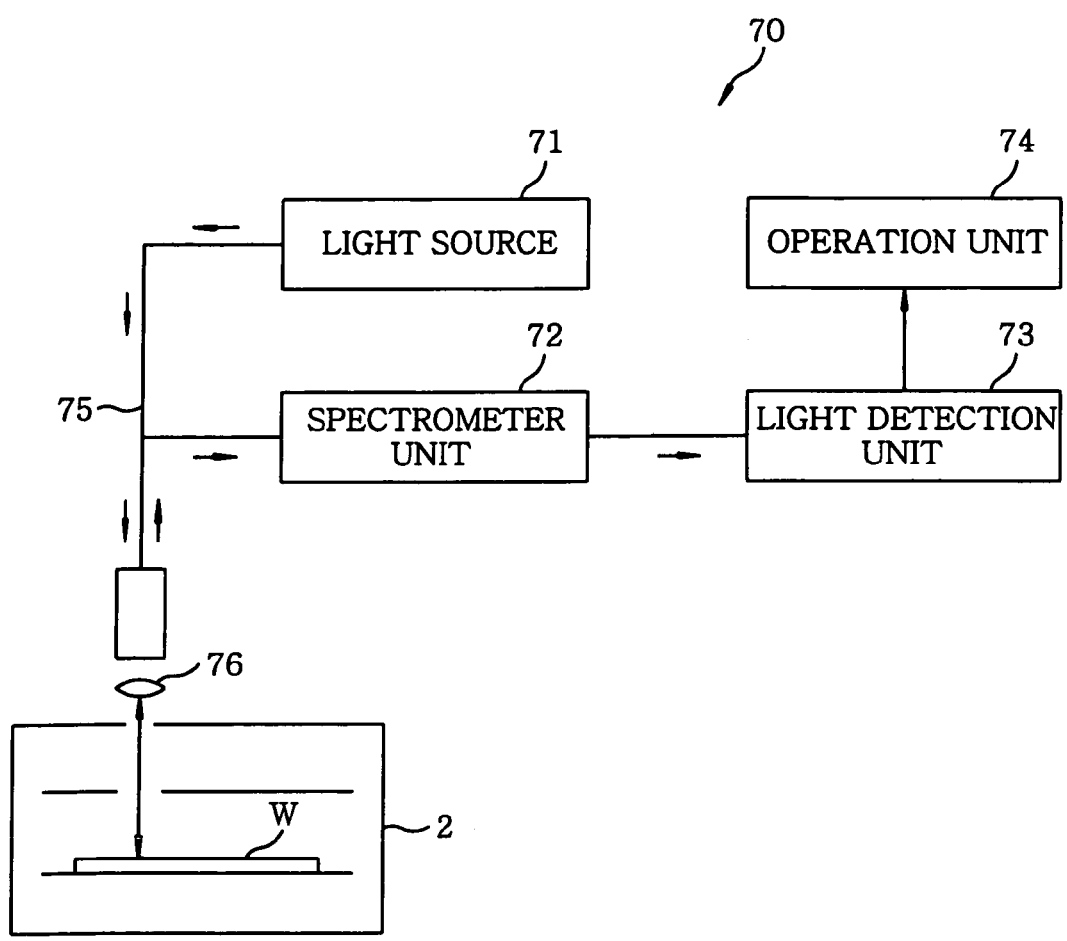
FIG. 3 illustrates a film thickness measuring unit.

FIG. 3 illustrates the film thickness measuring unit 70 schematically. The film thickness measuring unit 70 includes a light source 71 for irradiating a light toward the wafer W; a spectrometer unit 72 having a polychrometer for dispersing a reflected light from the wafer W into its spectrum; a light detection unit 73 for detecting the spectrum; and an operation unit 74 for processing the detection results from the light detection unit 73 based on a calibration curve obtained in advance.

When measuring the thickness of the silicon nitride film 102 during an etching process, a light from the light source 71 is irradiated toward the surface of the wafer inside the chamber 2 of the plasma etching apparatus 1 through an irradiation window (not shown) via an optical fiber 75 and a lens 76. The irradiated light is reflected at an interface of each layer on the wafer W. Then, the reflected light is sent to the spectrometer unit 72 to be spread its spectrum. The spectrum is detected by the light detection unit 73 and a spectral reflectance ratio is calculated by the operation unit 74.

The thickness of the silicon nitride film 102 serving as a mask is measured as follows. The light reflected from the surface of the silicon nitride film 102 and the light reflected from an interface between the silicon nitride film 102 and the silicon layer 101 interferes with each other. The intensity of the interfered light varies depending on the thickness of the silicon nitride film 102. Therefore, the thickness of the silicon nitride film 102 can be measured by detecting the interfered light.

When measuring the thickness of the silicon nitride film 102, a spectral reflectance is calculated in advance for an arbitrarily chosen thickness of the silicon nitride film 102 under the condition that an incident light falls on the wafer W vertically. Then, a ratio of the calculated spectral reflectance to a spectral reflectance measured at a time when no silicon nitride film 102 is formed (spectral reflectance ratio) is calculated to thereby obtain a calibration curve to be stored in a memory of the operation unit 74. It is preferable to obtain the calibration curve in such a specified range that covers the variation of the thickness of the silicon nitride film 102 to be etched during the etching process.

Thereafter, a light of multiple wavelengths is irradiated to the wafer W whose film thickness is to be measured. Then, the light reflected from the wafer W is dispersed into its spectrum and a spectral reflectance is calculated. Further, a ratio of the calculated spectral reflectance to a spectral reflectance measured at a time when no silicon nitride film 102 is formed on the wafer W (spectral reflectance ratio) is calculated, and the obtained spectral reflectance ratio is stored in the memory of the operation unit 74. Afterward, the measured values are fitted to a curve by employing a curve fitting method to compare it with the calibration curve, whereby the thickness of the silicon nitride film 102 can be found.

Each component of the plasma etching apparatus 1 is connected to and controlled by a process controller 60 with a CPU. A process manager can operate the plasma etching apparatus 1 by a user interface 61 connected to the process controller 60, and the user interface 61 includes a keyboard for inputting a command, a display for showing an operational status of the plasma etching apparatus 1 and the like.

Moreover, also connected to the processing controller 60 is a memory unit 62 for storing therein a recipe including a control program, processing condition data and the like to be used in realizing various processings performed in the plasma etching apparatus 1 under the control of the process controller 60.

Further, when receiving a command from the user interface 61 or film thickness information (control signal indicating an end point of etching) from the operation unit 74 of the film thickness measuring unit 70, a necessary recipe is retrieved from the memory unit 62 to be executed on the process controller 60, whereby a desired processing is performed in the plasma processing apparatus 1. Moreover, the necessary recipe to be used can be retrieved from a readable storage medium such as a CD-ROM, a hard disk, a flexible disk or the like, or retrieved through an on-line connected via, for example, a dedicated line to another apparatus available all the time.

Hereinafter, there will be explained a process for forming a groove (trench) by performing an etching on the wafer W made of single crystalline silicon by using the plasma processing apparatus 1 with the above-described configuration.

First, the gate valve 32 is opened and then the wafer W, on which the native oxide film 103 of silicon dioxide and the silicon nitride film 102 are formed, is carried into the chamber 2 from a load lock chamber (not shown) to be mounted on the electrostatic chuck 11. A DC voltage is then supplied from the DC power supply 13 to the electrostatic chuck 11, so that the wafer W is electrostatically attracted by the electrostatic chuck 11 to be adsorbed thereon.

Next, the gate valve 32 is closed and the chamber 2 is evacuated to a predetermined vacuum level by the gas exhaust unit 35. Then, the valve 28 is opened, and an etching gas containing, for example, $CF_4$ and Ar is supplied into a hollow portion of the upper electrode 21 from the processing gas supply source 30 via the process gas supply line 27 and the gas inlet port 26 while its flow rate is controlled to be, for example, $CF_4$/Ar=100/200 mL/min by the mass flow controller 29. The etching gas is discharged uniformly towards the wafer W through the injection openings 23 of the electrode plate 24, as indicated by arrows in FIG. 2.

In this BT step, while the inner pressure of the chamber 2 is maintained at a predetermined pressure level of, for example, 2.7 Pa (20 mTorr), a high frequency voltage of 600 W is applied to the upper electrode 21 from the first high frequency power supply 40, and another high frequency voltage of 220 W is applied to the susceptor (lower electrode) 5 from the second high frequency power supply 50, whereby the etching gas is converted into a plasma so that an etching can be performed on the native oxide film 103 on the wafer W. Further, a back pressure may be 1333 Pa (10 Torr) at both a central portion and an edge portion of the wafer W.

In the BT step, etching is performed while the thickness of the silicon nitride film 102 is monitored by using the film thickness measuring unit 70 on the basis of the reflected light of multiple wavelengths ranging from, for example, 240 nm to 350 nm, as described above. Then, when the thickness of the silicon nitride film 102 is reduced to a predetermined value, the etching is finished. Thus, the end point of etching is determined based on the thickness of the silicon nitride film 102 during the etching of the native oxide film 103, whereby the thickness of the silicon nitride film 102 can be made uniform. Therefore, generation of mask residues or variation in the residual amount of buried oxide film can be prevented in a subsequent CMP process.

In a main step following the BT step, a trench is formed in the silicon substrate 101. That is, the valve 28 is opened, and an etching gas containing, for example, $Cl_2$, HBr and $O_2$ gases is supplied into a hollow portion of the upper electrode 21 from the processing gas supply source 30 via the process gas supply line 27 and the gas inlet port 26 while the flow rates of the gases are controlled to be, for example, $Cl_2$/HBr/$O_2$=55/55/6 mL/min, respectively. The etching gas is discharged uniformly towards the wafer W through the injection openings 23 of the electrode plate 24, as indicated by arrows in FIG. 2.

In this main step, while the inner pressure of the chamber 2 is maintained at a predetermined pressure level of, for example, about 6.7 Pa (50 mTorr), a high frequency voltage of 250 W is applied to the upper electrode 21 from the first high frequency power supply 40, and another high frequency volt-age of 350 W is applied to the susceptor (lower electrode) 5 from the second high frequency power supply 50, whereby the etching gas is converted into a plasma such that an etching can be performed on the native oxide film 103 on the wafer W. Further, a back pressure may be set to be 1333 Pa (10 Torr) at both the central portion and the edge portion of the wafer W.

In the main step, etching is further performed while the depth of the trench 111 being formed in the silicon substrate 101 is being monitored by means of the film thickness measuring unit 70, and when the depth of the trench 111 reaches a predetermined value, the etching is finished. Further, in case of measuring the depth of the trench 111 in the main step, it is not necessary to detect the light of multiple wavelengths, but it is possible to measure the depth of the trench 111 by detecting only a reflected light of an arbitrarily chosen wavelength of, for example, 261 nm.

After the main step is completed, a typical STI process, that is, burying the oxide film and planarizing by CMP are performed, to thereby carry out device isolation.

Hereinafter, results of experiments conducted to confirm the effect of the present invention will be explained. An etching process was performed on a first to a fifth wafer by using the plasma etching apparatus 1 shown in FIG. 2. The first, the third and the fifth wafer are sample wafers, while the second and the fourth were dummy wafers. As for each sample wafer, the silicon nitride film (SiN) 102 and the native oxide film 103 were formed in the silicon substrate 101 as shown in FIG. 1A. On the other hand, each dummy wafer was a bare silicon substrate formed of silicon only.

The plasma etching was preferably conducted under the following condition: $CF_4$ and Ar were introduced into the chamber 2 at flow rates of 100 and 200 mL/min, respectively while the inner pressure of the chamber 2 was maintained at about 2.7 Pa; high frequency voltages of 600 W and 220 W were applied to the upper electrode 21 and the susceptor (lower electrode) 5 from the first and the second high frequency power supply 40 and 50, respectively; a back pressure was set to be 1333 Pa (10 Torr) at both the central portion and the edge portion of the wafer W; and the temperatures of the upper electrode 21, a sidewall and the susceptor 5 (i.e., wafer W) in the chamber 2 were set to be 80° C., 60° C. and 30° C., respectively.

As for each of the sample wafers (the first, the third and the fifth one), the thickness of the silicon nitride film 102 was monitored by the film thickness measuring unit 70, and the plasma etching was finished when the thickness of the silicon nitride film 102 was reduced to 70 nm. Further, for confirmation, the thickness of each sample wafer was actually measured before and after the etching by using a film thickness measuring device ASET F5 (manufactured by KLA-Tencor Corporation). The results are provided in Table 1, wherein a "measurement value" represents a film thickness obtained by the film thickness measuring unit 70 while an "actual measurement value" represents an actual film thickness measured by the film thickness measuring device ASET F5.

TABLE 1

| | | Thickness of SiN (nm) | | | |
| | | Before processing | | After processing | |
| Sample No. | Etching time (seconds) | Measurement value | Actual measurement value | Measurement value | Actual measurement value |
| --- | --- | --- | --- | --- | --- |
| First | 11.4 | 86.0 | 86.5 | 69.8 | 72.8 |
| Third | 11.3 | 84.6 | 85.2 | 69.8 | 71.4 |
| Fifth | 9.4 | 83.7 | 83.9 | 69.8 | 72.8 |

TABLE 1-continued

| | | Thickness of SiN (nm) | | | |
| | | Before processing | | After processing | |
| Sample No. | Etching time (seconds) | Measurement value | Actual measurement value | Measurement value | Actual measurement value |
|---|---|---|---|---|---|
| Variation between wafers | — | — | 2.6 | — | 1.4 |

From the Table 1, it is found that the variation in the thickness of the silicon nitride film 102 among the first, the third and the fifth sample wafer was reduced to 1.4 nm from 2.6 nm after performing an etching of a BT step while the thickness of the silicon nitride film 102 was being monitored. From the result, it is proved that the film thickness of a hard mask can be controlled to be uniform by performing an etching of a BT step while the film thickness of the hard mask being monitored.

Accordingly, the native oxide film 103 is etched while the thickness of the silicon nitride film 102 being monitored and then the silicon layer 101 is etched while the depth of the trench 111 being monitored, whereby the thickness of a mask layer (silicon nitride film 102) and the depth of the trench can be maintained uniform after the etching. Moreover, in this case, since the etched amount of silicon layer 101 is small in the BT step and the etched amount of silicon nitride film 102 is small in the main step, the STI can be performed precisely without errors.

While the invention has been shown and described with respect to the preferred embodiment, it will be understood by those skilled in the art that various changes and modifications may be made without departing from the spirit and scope of the invention as defined in the following claims.

For example, though a capacitively coupled parallel plate type etching apparatus is used in the above preferred embodiment, one of various plasma etching apparatuses, e.g., an inductively coupled type etching apparatus, can be employed as long as it is able to generate a plasma within a gas pressure range in accordance with the present invention. Furthermore, though the preferred embodiment has been described for the STI, the present invention can be applied to measurement of a film thickness in another etching processing.

What is claimed is:

1. An etching method of a substrate to be processed including a mask layer having a pattern; a layer to be etched, formed in a groove portion of the pattern; and a base layer formed beneath the mask layer and the layer to be etched,
   wherein an etching is performed on the layer to be etched while a thickness of the mask layer is being monitored,
   wherein the base layer is a silicon layer and the layer to be etched is a native oxide film formed on a surface of the silicon layer in the groove portion, and
   wherein the etching is finished when a thickness of the mask layer is reduced to a threshold value.

2. The etching method of claim 1, wherein the mask layer is a silicon nitride film.

3. The etching method of claim 1, wherein after etching the native oxide film, an etching is performed on the silicon layer by using the mask layer as a mask while an etched depth of the silicon layer is being monitored and finished when the etched depth reaches a specified value.

4. The etching method of claim 3, which is applied to a trench etching in shallow trench isolation.

5. The etching method of claim 4, wherein the monitoring of the thickness of the mask layer involves the steps of irradiating a light to the mask layer; detecting a reflected light from a surface of the mask layer and a reflected light from an interface between the mask layer and the silicon layer; calculating a spectral reflectance; and measuring the thickness of the mask layer based on a calibration curve obtained in advance by employing a curve fitting method.

6. The etching method of claim 1, wherein the base layer is in contact with the mask layer and layer to be etched before beginning the etching.

\* \* \* \* \*